United States Patent
Asakawa et al.

(10) Patent No.: US 11,194,090 B2
(45) Date of Patent: Dec. 7, 2021

(54) DISPLAY DEVICE

(71) Applicant: Japan Display Inc., Tokyo (JP)

(72) Inventors: Youichi Asakawa, Tokyo (JP); Ken Onoda, Tokyo (JP); Hiroaki Kijima, Tokyo (JP); Shinichi Komura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 17/009,959

(22) Filed: Sep. 2, 2020

(65) Prior Publication Data

US 2020/0400871 A1    Dec. 24, 2020

Related U.S. Application Data

(63) Continuation of application No. PCT/JP2019/008721, filed on Mar. 5, 2019.

(30) Foreign Application Priority Data

Mar. 8, 2018    (JP) .............................. JP2018-042229

(51) Int. Cl.
  *F21V 8/00*   (2006.01)
  *G02F 1/1335*   (2006.01)
  (Continued)

(52) U.S. Cl.
  CPC ..... *G02B 6/0068* (2013.01); *G02F 1/133512* (2013.01); *G02F 1/133514* (2013.01); *G02F 1/133621* (2013.01); *H01S 5/4093* (2013.01)

(58) Field of Classification Search
  CPC ............. G02B 6/0068; G02F 1/133512; G02F 1/133514; G02F 1/133621; G02F 1/4093
  (Continued)

(56) References Cited

U.S. PATENT DOCUMENTS

2007/0085862 A1\* 4/2007 Moriya ................ G09G 3/3607
                                                                345/694
2016/0033813 A1     2/2016 Yoon et al.
(Continued)

FOREIGN PATENT DOCUMENTS

JP       2016-35572 A      3/2016
JP       2017-54088 A      3/2017
(Continued)

OTHER PUBLICATIONS

International Search Report dated Apr. 23, 2019 in PCT/JP2019/008721 filed Mar. 5, 2019, 1 page.

*Primary Examiner* — Charles S Chang
(74) *Attorney, Agent, or Firm* — Oblon, McClelland, Maier & Neustadt, L.L.P.

(57) ABSTRACT

According to one embodiment, a display device displays a color gamut defined by connecting a first defined color in first chromaticity coordinates, a second defined color in second chromaticity coordinates, and a third defined color in third chromaticity coordinates. An illumination device of the display device includes green, blue and red lasers. The green and blue lasers emit light of the second and third defined colors, and red laser emits light of a color in fourth chromaticity coordinates. Each of the pixels displays a color including the first defined color by mixing light in the fourth chromaticity coordinates and the second defined color.

12 Claims, 7 Drawing Sheets

(51) Int. Cl.
 *G02F 1/13357* (2006.01)
 *H01S 5/40* (2006.01)
(58) Field of Classification Search
 USPC .................................................. 349/106–109
 See application file for complete search history.

(56) References Cited

U.S. PATENT DOCUMENTS

2017/0139269 A1* 5/2017 Asakawa .......... G02F 1/133621
2017/0201068 A1 7/2017 Furuya et al.

FOREIGN PATENT DOCUMENTS

JP 2017-90799 A 5/2017
JP 2017-125885 A 7/2017

* cited by examiner

DISPLAY DEVICE

CROSS-REFERENCE TO RELATED APPLICATIONS

This application is a Continuation Application of PCT Application No. PCT/JP2019/008721, filed Mar. 5, 2019 and based upon and claiming the benefit of priority from Japanese Patent Application No. 2018-042229, filed Mar. 8, 2018, the entire contents of all of which are incorporated herein by reference.

FIELD

Embodiments described herein relate generally to a transmissive display device.

BACKGROUND

Broadcasting service television (BT). 2020 standardized in the 4K/8K broadcast covers a wide color range which is approximately 1.7 times the BT. 709 used in a conventional high definition broadcasting field. To cover such a wide color range, laser light having a color purity higher than LED light is required in each subpixel.

In the BT. 2020 standard, red is defined to have a wavelength of 630 nm. On the other hand, laser light which can be efficiently extracted from a red semiconductor laser (laser diode) has, for example, a wavelength of approximately 638 nm. When a semiconductor laser with the output wavelength of 630 nm is used, the light emission efficiency greatly decreases as compared to a case where a semiconductor laser with the output wavelength of approximately 638 nm is used.

Conventional techniques have been mainly focusing on widening the color range displayed by display devise as great as possible to conform to the standard. A technique of narrowing such a too wide color range down to conform the standard has almost never been proposed. If a red semiconductor laser is used as a light source, a match ratio of the color range of a display device and a standard is compromised in view of power consumption.

DETAILED DESCRIPTION

In general, according to one embodiment, a display device displays a color gamut defined by connecting a first defined color in first chromaticity coordinates, a second defined color in second chromaticity coordinates, and a third defined color in third chromaticity coordinates in a CIExy chromaticity diagram. The display device includes a display panel and an illumination device. In the display device, a plurality of pixels displaying the color gamut are arranged. The illumination device radiates light to the display panel. The illumination device includes a green semiconductor laser, a blue semiconductor laser, and a red semiconductor laser. The green semiconductor laser emits laser light of the second defined color, blue semiconductor laser emits laser light of the third defined color, and red semiconductor laser emits laser light of a color in fourth chromaticity coordinates which is different from the first defined color. Each of the pixels displays a color including the first defined color by mixing the laser light in the fourth chromaticity coordinates and the laser light of the second defined color.

With such a structure, a display device of high quality, having an excellent match ratio with a defined color range can be provided.

Embodiments will be explained hereinafter with reference to the accompanying drawings. Note that the disclosure is merely an example, and any embodiment which is conceivable by a person having an ordinary skill in the art within the spirit of the invention is encompassed by a range of the present invention. Furthermore, for better understanding of the explanation, figures may be drawn more schematically as compared to an actual embodiment, and they are merely for clarification. Such schematic illustration does not limit the interpretation of the present invention. In each figure, some of same or similar elements arranged continuously may not be denoted, and the reference numbers may be omitted. Furthermore, in the description and each figure, structural elements which are functionally the same or similar to those have been explained already will be referred to by the same reference numbers and the explanation considered to be redundant will be omitted.

Now, a common structure of the following embodiments will be explained with reference to FIGS. 1 to 4. In each embodiment, a liquid crystal display device DSP will be used as an example of the display device. However, each embodiment does not prevent various technical ideas of each embodiment from being applied to various display devices.

Various display devices may include, for example, a display device including mechanical display cells such as micro-electromechanical system (MEMS) shutter or the like. The display device of the present application can be utilized in various electronic devices such as a smartphone, tablet terminal, mobile phone, personal computer, television system, in-car device, gaming device, and wearable device.

Figure 1:
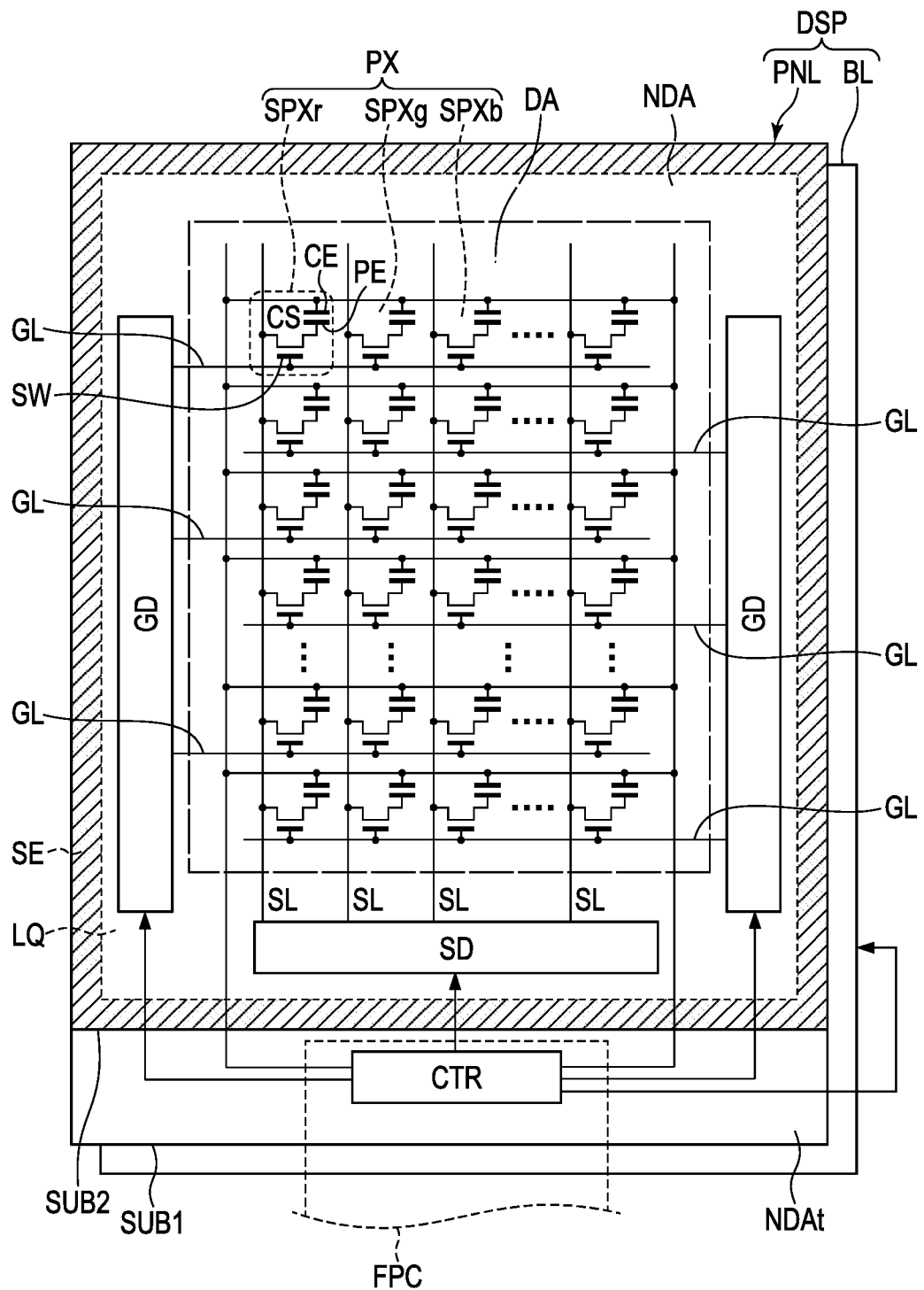
FIG. 1 is a plan view illustrating a schematic structure of a display device common with embodiments.

FIG. 1 is a plan view of a schematic structure of a liquid crystal display device DSP. As in FIG. 1, the liquid crystal display device DSP includes a display panel (liquid crystal cell) PNL including a display surface and a rear surface, illumination device (backlight) BL which irradiates light onto the rear surface of the display panel PNL, and controller CTR which controls operations of the display panel PNL and the illumination device BL.

The display panel PNL displays an image on the display surface by selectively passing the light incident on the rear surface. The display surface of the display panel PNL may be a flat surface, or a curved surface. In the following description, viewing the display surface of the display panel PNL toward the rear surface thereof will be defined as a plan view. The display panel PNL includes a first substrate (array substrate) SUB1, second substrate (counter substrate) SUB2, sealant SE which is an adhesive agent, and liquid crystal layer LQ. The liquid crystal layer LQ is an example of an electro-optic layer which is driven by electricity to selectively pass the light. Note that the electro-optic layer may be the aforementioned MEMS shutter.

The second substrate SUB2 is opposed to the first substrate SUB1 in the thickness direction of the display panel PNL. The first substrate SUB1 is formed to be larger than the second substrate SUB2, and includes a mount region NDAt exposed from the second substrate SUB2. On the mount region NDAt, a drive circuit substrate FPC is mounted.

The drive circuit substrate FPC sequentially receives image data of one frame to be displayed on the display panel PNL from a main board or the like of an electronic device to which the liquid crystal display device DSP is mounted, for example. The image data include data of display color and the like of each pixel PX, for example. In the drive circuit substrate FPC, a control module which is an example of the controller CTR is disposed, for example. Note that, the control module may be provided with the first substrate SUB1 instead of the drive circuit substrate FPC.

The sealant SE corresponds to an up-toward-right hatched part in FIG. 1, and adheres the first substrate SUB1 and the second substrate SUB2 together. The liquid crystal layer LQ is, inside the sealant SE, held between the first substrate SUB1 and the second substrate SUB2. The display surface of the display panel PNL includes a display area DA to display an image and a non-display area (frame area) NDA surrounding the display area DA.

The non-display area NDA includes the aforementioned mount region NDAt. A plurality of subpixels SPX are arranged in a matrix in the display area DA. For example, a pixel PX which can perform color display is formed of a combination of three subpixels SPX (SPXr, SPXg, and SPXb) corresponding to red, green, and blue, respectively.

The first substrate SUB1 includes a plurality of scan signal lines GLs, and a plurality of image signal lines SLs crossing the scan signal lines GLs. The subpixel SPX corresponds to an area defined by two adjacent scan signal lines GLs and adjacent two image signal lines SLs. The first substrate SUB1 includes a scan driver SD connected to each scan signal line GL and an image driver SD connected to each image signal line SL.

The scan driver GD and the image driver SD are disposed in the non-display area NDA, and can be formed in the same process as with a switching element SW which will be described later. Note that the scan driver GD and the image driver SD may be disposed in the drive circuit substrate FPC instead of the first substrate SUB1, or may be disposed in the control module.

The first substrate SUB1 includes, in each subpixel SPX, a switching element SW and a pixel electrode PE. The switching element SW is formed of a thin film transistor (TFT), for example, and is electrically connected to the scan signal line GL, image signal line SL, and pixel electrode PE. A common electrode CE is extended to be opposed to the subpixels SPX. The common electrode CE may be disposed in the first substrate SUB1 or in the second substrate SUB2.

The controller CTR controls the scan driver GD and the image driver SD based on the received image data. The scan driver GD supplies a scan signal to each scan signal line GL, and the image driver SD supplies an image signal to each image signal line SL. When a scan signal is supplied to a scan signal line GL corresponding to a switching element SW, an image signal line SL and a pixel electrode PE corresponding to the switching element SW are electrically connected, and the image signal of the image signal line SL is supplied to the pixel electrode PE. The pixel electrode PE forms an electric field between itself and the common electrode CE to change alignment of liquid crystal molecules of the liquid crystal layer LQ. The capacitance CS is formed between the common electrode CE and the pixel electrode PE, for example.

Figure 2:
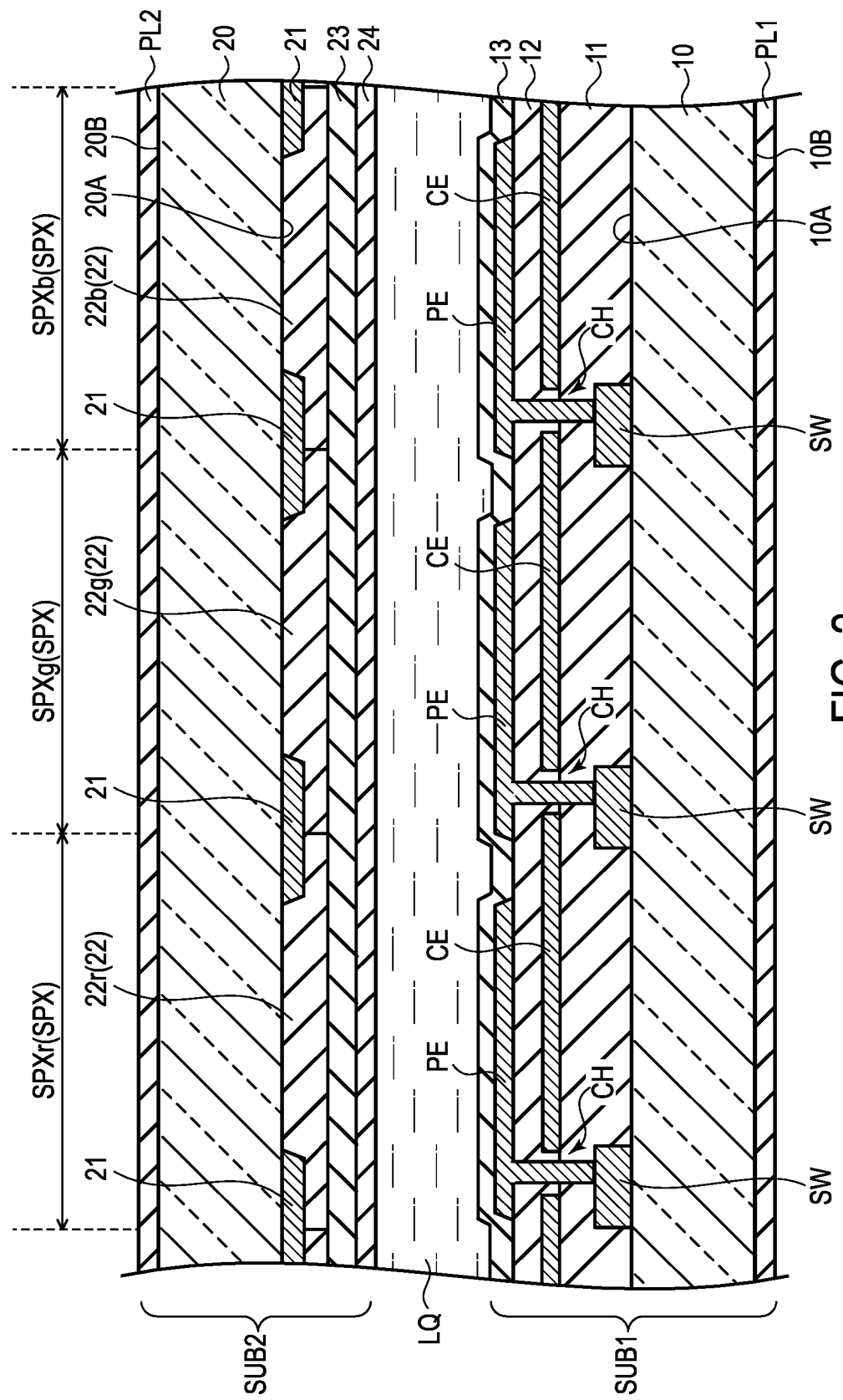
FIG. 2 is a cross-sectional view of the schematic structure of a display device of FIG. 1.

FIG. 2 is a cross-sectional view of the liquid crystal display device DSP in the display area DA. The first substrate SUB1 includes, in addition to the scan signal line GL, image signal line SL, scan driver GD, image driver SD, switching element SW, pixel electrode PE, and the common electrode CE, a first transparent substrate 10, first insulating layer 11, second insulating layer 12, and first alignment layer 13. The first transparent substrate 10 is formed of a glass substrate or a resin substrate of light transparency, and includes a first surface 10A opposed to the second substrate SUB2 and a second surface 10B opposite to the first surface 10A.

The switching element SW is disposed on the first surface 10A of the first transparent substrate 10, and is covered with the first insulating layer 11. Note that, in the example of FIG. 2, the scan signal line GL, image signal line SL, switching element SW, and the like are simplified for easier understanding of the embodiment. In actuality, the first insulating layer 11 including a plurality of layers, and the switching element SW includes a semiconductor layer and various electrodes in these layers.

The common electrode CE is formed on the first insulating layer 11. The common electrode CE is covered with the second insulating layer 12. The pixel electrode PE is formed on the second insulating layer 12, and is opposed to the common electrode CE. Each pixel electrode PE is electrically connected to the switching element SW of the subpixel SPX through a contact hole CH.

The pixel electrode PE and the common electrode CE are formed of a transparent conductive material such as indium tin oxide (ITO) or indium zinc oxide (IZO). The first alignment film 13 covers the pixel electrode PE and is in contact with the liquid crystal layer LQ. The first alignment film 13 has been subjected to an alignment process such as a rubbing process or an optical alignment process.

The second substrate SUB2 includes a second transparent substrate 20 such as a light transmissive glass substrate or resin substrate. The second transparent substrate 20 includes a third surface 20A opposed to the first substrate SUB1 and a fourth surface 20B which is in the opposite side of the third surface 20A. Furthermore, the second substrate SUB2 includes a light shielding layer (black matrix) 21, color filter layer 22, overcoat layer 23, and second alignment film 24.

The light shielding layer 21 is formed on the third surface 20A of the second transparent substrate 20. The color filter layer 22 covers the light shielding layer 21 and the second transparent substrate 20. The light shielding layer 21 is, in a plan view, formed in the non-display area NDA. Furthermore, the light shielding layer 21 is, in the display area DA, formed directly above the scan signal line GL and the image signal line SL to define the subpixel SPX.

The color filter layer 22 is opposed to the pixel electrode PE and partly overlaps the light shielding layer 21. Note that, the color filter layer 22 may be formed on the first substrate SUB1 instead of the second substrate SUB2. The color filter layer 22 includes first to third filter layers 22r, 22g, and 22b arranged to conform to red, green, and blue pixels SPXr, SPXg, and SPXb, respectively. The overcoat layer 23 covers the color filter layer 22. The second alignment film 24 covers the overcoat layer 23 and is in contact with the liquid crystal layer LQ.

In the second surface 10B of the first transparent substrate 10, a first polarizer PL1 is disposed, and in the fourth surface 20B of the second transparent substrate 20, a second polarizer PL2 is disposed. Note that, in a case where the illumination device emits polarized laser light, the first polarizer may be omitted. If a MEMS shutter is used in the electro-optic layer instead of the liquid crystal layer LQ, the first and second polarizers PL1 and PL2 may be omitted.

Figure 3:
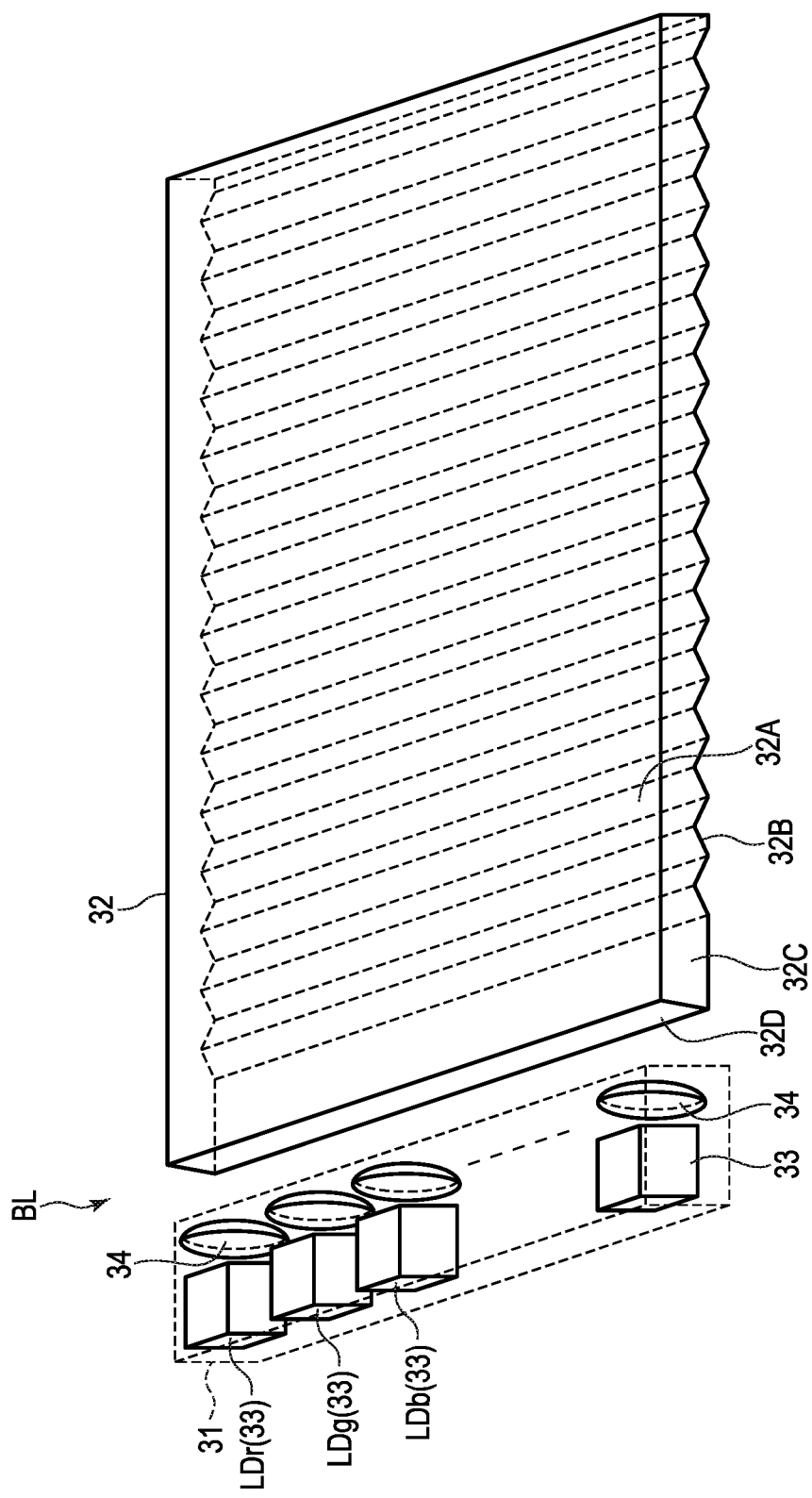
FIG. 3 is a perspective view of the schematic structure of an illumination device of FIG. 1.

FIG. 3 is a perspective view of an example of the illumination device BL of FIG. 1. In the example of FIG. 3, the illumination device BL is structured as an edge type, and includes a light source module 31 which emits light and a light guide plate 32 which guides the light from the light source module 31 to the display panel PNL. Note that, if a direct illumination device BL is adopted, the light guide plate 32 may be omitted. In that case, the light source module 31 is opposed to the rear surface of the display panel PNL, instead of the light guide plate 32.

The guide light plate 32 includes, in the display area DA, an exit surface 32A opposed to the rear surface of the display panel PNL, reflection surface 32B which is in the opposite side of the exit surface 32A, and end surface 32C connecting the exit surface 32A and the reflection surface 32B. The end surface 32C includes an incident surface 32D. The light source module 31 includes a plurality of light sources 33 arranged along the incident surface 32D of the light guide plate 32. Between each light source 33 and the incident surface 32D, an optical system 34 such as a collimator or the like may be disposed.

The light sources 33 include a red semiconductor laser LDr, green semiconductor laser LDg, and blue semiconductor laser LDb. In the example of FIG. 3, each light source 33 is structured with any one of the red semiconductor laser LDr, green semiconductor laser LDg, and blue semiconductor laser LDb of single wavelength light source.

Note that, each light source 33 may be an assembly-type white semiconductor laser including a red semiconductor laser LDr, green semiconductor laser LDg, and blue semiconductor laser LDb. The white semiconductor laser emits laser light of mixed colors in which the laser light from each of the semiconductor lasers LDr, LDg, and LDb converged by a dichroic mirror or the like.

The red semiconductor laser LDr is formed of, for example, a semiconductor material of aluminum gallium indium phosphorus (AlGaInP), and emits laser light center wavelength of which is approximately 538 nm. The green semiconductor laser LDg is formed of, for example, a semiconductor material of indium gallium nitride (InGaN), or zinc selenide (ZnSe), and emits laser light center wavelength of which is approximately 532 nm.

The blue semiconductor laser is formed of, for example, a semiconductor material of indium gallium nitride (InGaN), or zinc selenide (ZnSe), and emits laser light center wavelength of which is approximately 467 nm. Note that there are individual differences in the semiconductor lasers, and even in the semiconductor lasers of the same color, the center wavelength of laser light may be varied by approximately 1 nm.

Figure 4:
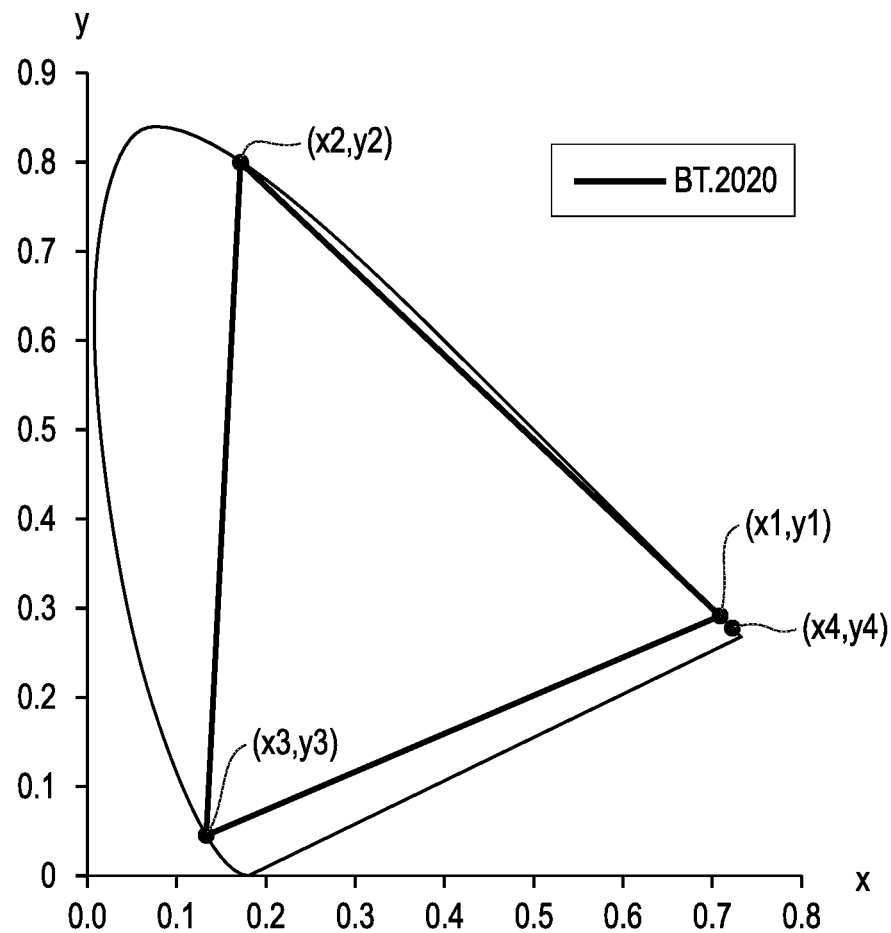
FIG. 4 is a CIExy chromaticity diagram indicating the gamut of first to third defined colors to be displayed by the display device.

FIG. 4 is a CIExy chromaticity diagram (CIE1931) illustrating a gamut defined by a standard or the like to be displayed on the liquid crystal display device DSP. One of the characteristics of the liquid crystal display device DSP is, in order to display a gamut in a triangle formed by connecting first to third chromaticity coordinates (x1, y1), (x2, y2), (x3, y3), using a semiconductor laser LD (red semiconductor laser LDr) of a color of fourth chromaticity coordinates (x4, y4) in the outside of the gamut, instead of a color inside of the gamut.

In the following explanation, colors of the first to third chromaticity coordinates (x1, y1), (x2, y2), (x3, y3) defined as apexes of a triangle gamut (three primal colors) to be displayed on the liquid crystal display device DSP will be referred to as first to third defined colors, respectively. An example of the first defined color is red primary (x=0.708, y=0.292) defined by the BT. 2020, having a wavelength of 630 nm.

An example of the second defined color is green primary (x=0.170, y=0.797) defined by the BT. 2020, having a wavelength of 532 nm. An example of the third defined color is blue primary (x=0.131, y=0.046) defined by the BT. 2020, having a wavelength of 467 nm.

The green semiconductor laser LDg emits laser light of second defined color (wavelength of 532 nm). The blue semiconductor laser LDb emits laser light of third defined color (wavelength of 467 nm). On the other hand, the red semiconductor laser LDr emits laser light having a wavelength of 638 nm which is different from the first defined color (wavelength of 630 nm). The wavelength of 638 nm is a wavelength from a light source having the best light emission efficiency amongst commercially used light sources. Furthermore, in addition thereto, a light source having a wavelength of 637 or 639 nm may be used instead.

Figure 5:
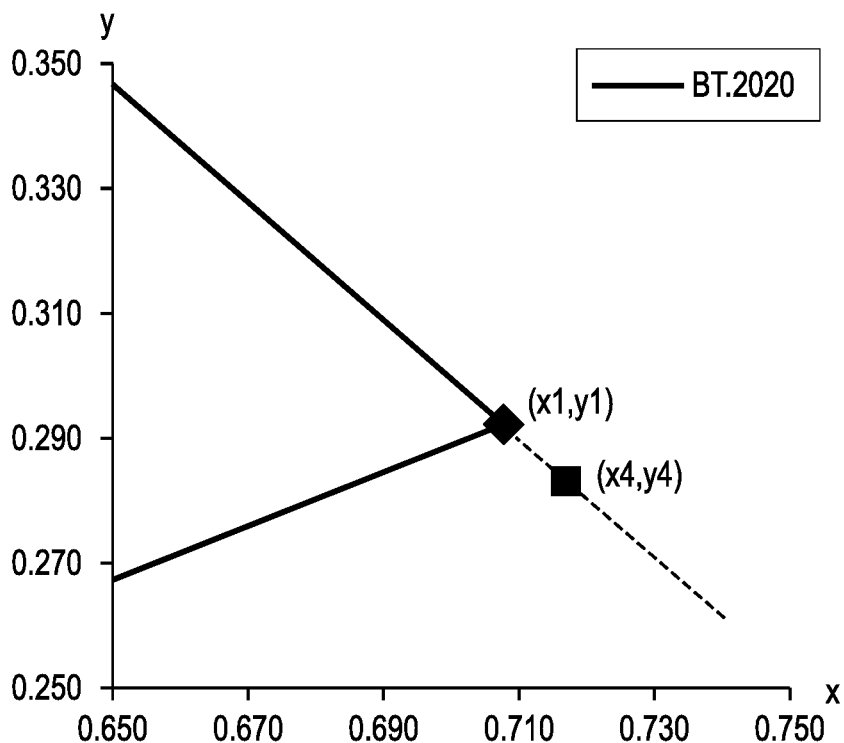
FIG. 5 is a CIExy chromaticity diagram indicating the gamut represented by x=0.650 to 0.750, y=0.250 to 0.350 of FIG. 4, in an enlarged manner.

FIG. 5 is a CIExy chromaticity diagram (CIE1931) illustrating the gamut of x=0.650 to 0.750, y=0.250 to 0.350 of FIG. 4 in an enlarged manner. The fourth chromaticity coordinates (x4, y4) of a color of wavelength 638 nm are positioned outside the triangle formed by connecting the first to third chromaticity coordinates (x1, y1), (x2, y2), (x3, y3).

The fourth chromaticity coordinates (x4, y4) are on a straight line on an extension of the line connecting the second and first chromaticity coordinates (x2, y2), (x1, y1), the extension going from the second chromaticity coordinates (x2, y2) to the first chromaticity coordinates (x1, y1) in the xy chromaticity diagram. Specifically, when a straight line connecting the second and first chromaticity coordinates (x2, y2), (x1, y1) is represented by linear function of Y=aX+b (a and b are constants), the fourth chromaticity coordinates are within a range of (x4=X±0.009, y4=Y±0.009). Note that ±0.009 in the xy chromaticity diagram corresponds to approximately ±8 nm of wavelength which is an individual difference of the semiconductor lasers LDs.

That is, the first coordinates (x1, y1) are substantially positioned on the line connecting the fourth and second chromaticity coordinates (x2, y2), (x4, y4). The color (x1, y1) on the line connecting the two points (x2, y2), (x4, y4) in the xy chromaticity diagram can be reproduced by mixing the colors of the two points (x2, y2), (x4, y4).

For example, when the laser light of 532 nm is mixed to the laser light of 638 nm in order to produce an output ratio of 1/0.01, a display device of high quality which has excellent color reproducibility matching the first defined color (630 nm) can be achieved. In the following description, specific structures thereof will be explained with reference to FIGS. 6 to 9.

First Embodiment

The first embodiment will be explained with reference to FIG. 6. The liquid crystal display device DSP of the first embodiment is configured such that a first filter layer 22r disposed in a red pixel SPXr functions as a dichroic transmission filter to pass red laser light and to pass part of green laser light while absorbing the residue thereof.

The first filter layer 22r is an orange film colored in an orange color, for example, which effectively passes the red laser light (single wavelength of color of the fourth chromaticity coordinates (x4, y4)) emitted from the red semiconductor laser LDr. Furthermore, the first filter layer 22r passes the green laser light (single wavelength of color of the second chromaticity coordinates (x2, y2)) emitted from the green semiconductor laser LDg at a certain transmissive ratio.

Figure 6:
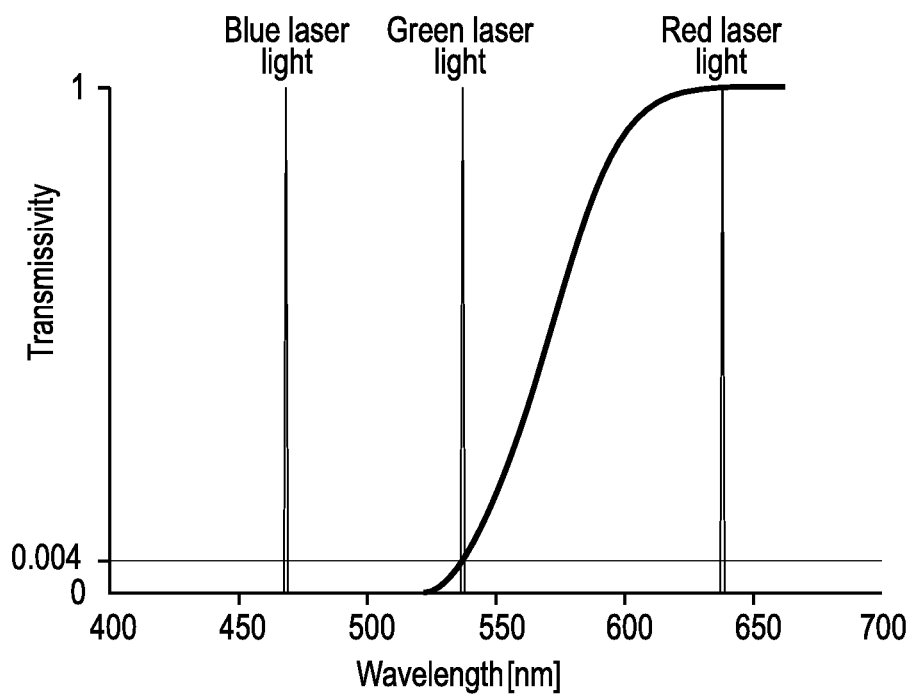
FIG. 6 is a diagram illustrating transmissivity of a dichroic transmission filter of the display device of the first embodiment.

In the example of FIG. 6, the first filter layer 22r passes the green laser light output of which is 1/250 of the red laser light. With the liquid crystal display device DSP of the first embodiment including such a dichroic transmission filter, the red pixel SPXr can display red of the first defined color using a rear surface illumination which is different from the first defined color. Furthermore, since the highly efficient red semiconductor laser LDr can be used, the power can be saved.

Second Embodiment

The second embodiment will be explained with reference to FIG. 7. The second embodiment is a variation of the first embodiment, in which the structure of the dichroic transmission filter is altered. In the second embodiment, a first filter layer 22r disposed in a red pixel SPXr includes a red region which efficiently passes the red laser light and a green region which efficiently passes the green laser light separately.

Figure 7:
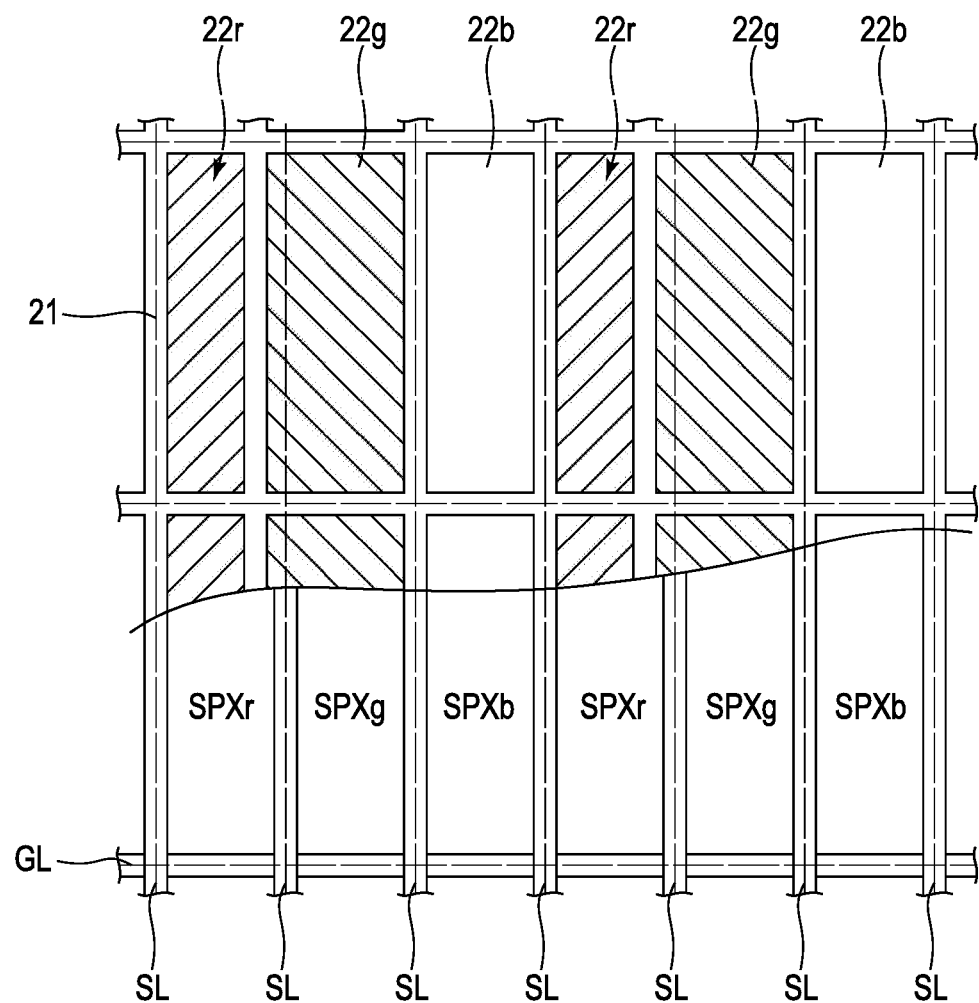
FIG. 7 is a plan view illustrating a dichroic transmission filter of the display device of the second embodiment.

The area surrounded by a two-dot broken line in FIG. 7 includes subpixels SPXr, SPXg, and SPXb. The part of the color filter layer 22 overlapping the red pixel SPXr is a first filter layer 22r. Similarly, the part of the color filter layer 22 overlapping the green pixel SPXg is a second filter layer 22g, and the part of the color filter layer 22 overlapping the blue pixel SPXb is a third filter layer 22b.

In the up-to-right hatched area of FIG. 7, a red film which efficiently passes red laser light is formed. In the down-to-right hatched area of FIG. 7, a green film which efficiently passes green laser light is formed. In the example of FIG. 7, the green film is formed integrally over the first and second filter layers 22r and 22g adjacent to each other. Note that the green film may be formed separately with respect to the first filter layer 22r and the second filter layer 22g.

In the second embodiment, the first filter layer 22r includes a red region in which the red film is formed and a green region in which the green film is formed. The first filter layer 22r with two different color films is an example of the dichroic transmission filter. An area ratio of the red region with the green region is, for example, 1:1.3. In the second embodiment, as in the first embodiment, the red pixel SPXr can display the red of first defined color using the rear surface illumination which is different from the first defined color.

Third Embodiment

The third embodiment will be explained with reference to FIGS. 8 and 9. In the aforementioned first and second embodiments, the red pixel SPXr displays the first defined color, and thus, the pixel PX displays the color containing the first defined color. In contrast, in the third embodiment and a fourth embodiment which will be described later, the red pixel SPXr exerts light of a color corresponding to fourth chromaticity coordinates, which is different from the first defined color. The pixel PX displays the color containing the first defined color by mixing the color displayed by the red pixel SPXr and the color displayed by the green pixel SPXg.

The liquid crystal display device DSP of the third embodiment rapidly turns on red, green, and blue semiconductor lasers LDr, LDg, and LDb in a time divisional manner, and in synchronization with this, rapidly switches the images to chronologically mix the colors. For example, a single frame is divided into the former half and the latter half, and the first defined color of 100% output and the third defined color of 50% output are displayed in the first half field while the second defined color of 100% output and the third defined color of 50% output are displayed in the second half field.

In a single frame, the first to third colors are mixed such that an afterimage of 50% output of each color can be seen. The first and second filter layers 22r and 22g of the red pixel SPXr and the green pixel SPXg include, for example, a yellow film which efficiently passes the red laser light and the green laser light while absorbing the blue laser light. In the blue pixel SPXb, a blue film which absorbs the red laser light and the green laser light while efficiently passes the blue laser light is formed, for example.

Figure 8:
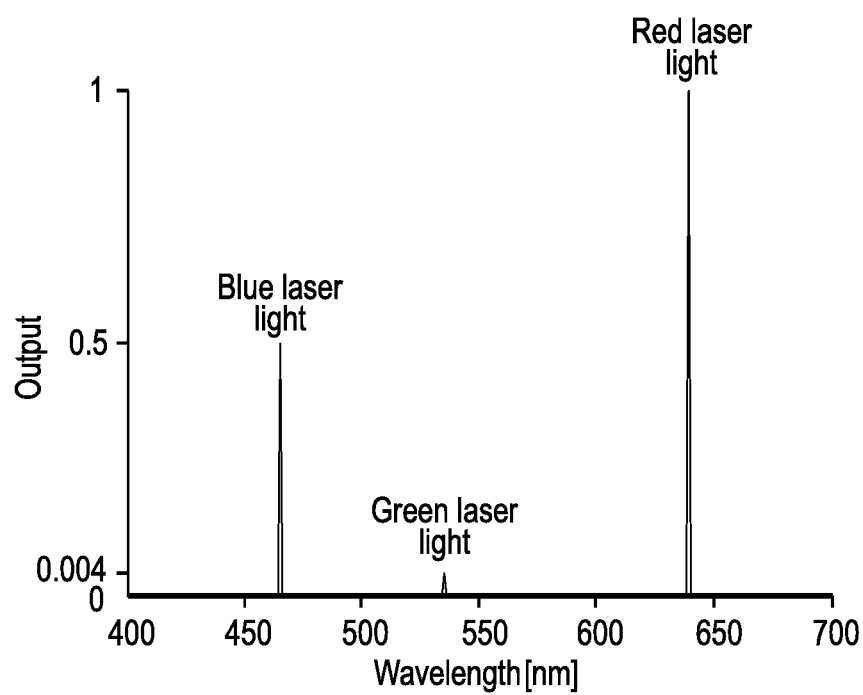
FIG. 8 illustrates outputs of each of semiconductor lasers in a first half field of the display device of the third embodiment.
Figure 9:
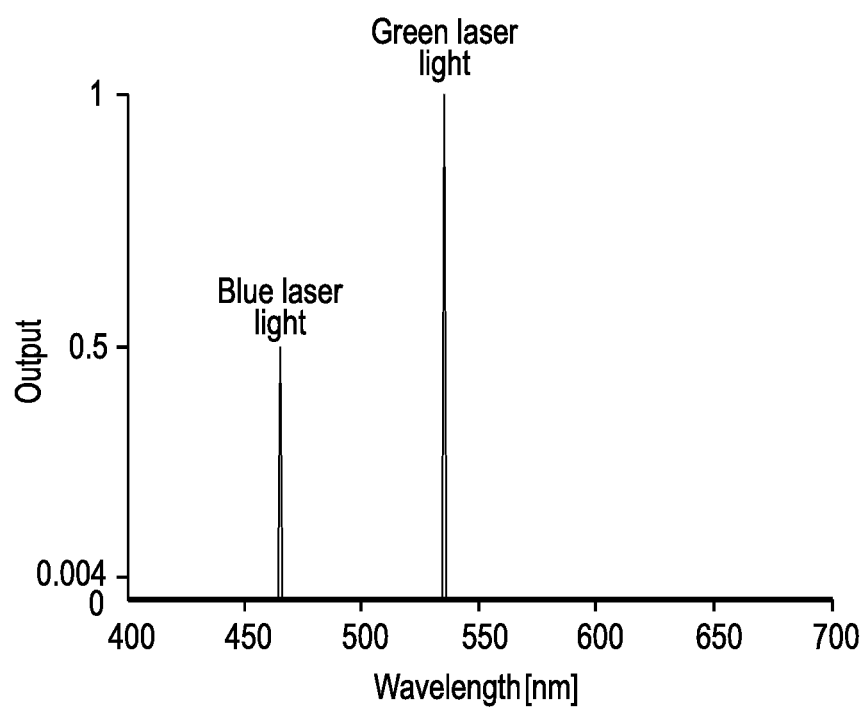
FIG. 9 illustrates outputs of each of semiconductor lasers in a second half field of the display device of the third embodiment.

FIGS. 8 and 9 are diagrams illustrating an output of each semiconductor laser in the first and second half fields. As in FIG. 9, in the second half field to display the second and third defined colors, the green semiconductor laser LDg and the blue semiconductor laser LDb are turned on. On the other hand, in the first half filed to display the first and third defined colors, the green semiconductor laser LDg is turned on in addition to the red semiconductor laser LDr and the blue semiconductor laser LDb. The output of the green semiconductor laser LDg in the first half field is, for example, 1/250 of the output of the red semiconductor laser LDr.

In the liquid crystal display device DSP of the third embodiment structured as above, the green laser light is gleamingly turned on in the fields to display the first and third defined colors in addition to the red laser light and the blue laser light. The red laser light passing the red pixel SPXr and the green laser light passing the green pixel SPXg are mixed to conform to the first defined color.

Fourth Embodiment

The fourth embodiment will be explained with reference to FIG. 1. In the fourth embodiment, the controller CTR which receives the image data converts the image signal such that the gamut to be displayed by the pixels PX matches the gamut defined by the first to third defined colors. For example, upon receipt of the image data to command the red pixel SPXr to display the color containing the first defined color, the controller CTR commands the red pixel SPXr to display the color corresponding to the fourth chromaticity coordinates (x4, y4), which is different from the first defined color.

At that time, the controller CTR converts the image signal such that the luminosity (hue) of the green pixel SPXg to display the second defined color becomes blighter than that from the original image signal. The green laser light of the green pixel SPXg is used for matching the color conforming to the fourth chromaticity coordinates (x4, y4) of the red pixel SPXr, which is different from the first defined color, with the first defined color, in addition to displaying the second defined color.

The green components in the converted image signal are, for example, a sum of the luminosity of the green pixel SPXg to be displayed based on the original image signal and the luminosity of the green laser light to be added corresponding to the luminosity of the red pixel SPXr. The luminosity of the green laser light to be added corresponding to the luminosity of the red pixel SPXr is, for example, 1/250 in an output ratio.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. The structures disclosed in the embodiments may be combined arbitrarily.

What is claimed is:

1. A display device for displaying a color gamut defined by connecting a first defined color in first chromaticity coordinates, a second defined color in second chromaticity coordinates, and a third defined color in third chromaticity coordinates in a CIExy chromaticity diagram, the display device comprising:
    a display panel in which a plurality of pixels displaying the color gamut are arranged; and an illumination device configured to radiate light to the display panel, wherein
    the illumination device includes a green semiconductor laser configured to emit laser light of the second defined color, a blue semiconductor laser configured to emit laser light of the third defined color, and a red semiconductor laser configured to emit laser light of a color in fourth chromaticity coordinates which is different from the first defined color,
    each of the pixels displays a color including the first defined color by mixing the laser light in the fourth chromaticity coordinates and the laser light of the second defined color,
    each of the pixels includes a red pixel to display the laser light of the color in the fourth chromaticity coordinates which is different from the first defined color, a green pixel to display the second defined color, and a blue pixel to display the third defined color, where a first field to display the first defined color and the third defined color and a second field to display the second defined color and the third defined color are displayed in a time divisional manner,
    the red pixel and the green pixel include yellow filters configured to pass the color of the fourth chromaticity coordinates and the laser light of the second defined color, and the blue pixel includes a blue filter configured to pass the third defined color,
    the illumination device turns on, in the first field, the green semiconductor laser in addition to the red semiconductor laser and the blue semiconductor laser, and each of the pixels mixes the laser light of the second defined color into the laser light of the color in the fourth chromaticity coordinates to match the first defined color, and
    in the first field, an output of the green semiconductor laser is 1/250 of an output of the red semiconductor laser.

2. The display device of claim 1, wherein the fourth chromaticity coordinates are on an extended line of a line from the second chromaticity coordinates to the first chromaticity coordinates.

3. The display device of claim 1, wherein a wavelength of the color of the fourth chromaticity coordinates is greater than a wavelength of the first defined color.

4. The display device of claim 1, wherein a wavelength of the first defined color is 630 nm, a wavelength of the second defined color is 532 nm, and the wavelength of the color in the fourth chromaticity coordinates is between 637 and 639 nm.

5. The display device of claim 1, wherein each of the pixels includes a red pixel displaying the first defined color, a green pixel displaying the second defined color, and a blue pixel displaying the third defined color,
    the red pixel includes a dichroic transmission filter, and
    the dichroic transmission filter is an orange film configured to pass the laser light of the color in the fourth chromaticity coordinates, to pass a part of the laser light of the second defined color, and to absorb the residue of the laser light of the second defined color.

6. The display device of claim 5, wherein the transmissivity of the dichroic transmission filter with respect to the laser light of the second defined color is less than the transmissivity of the dichroic transmission filter with respect to the laser light of the color in the fourth chromaticity coordinates.

7. The display device of claim 1, wherein
    each of the pixels includes a red pixel displaying the first defined color, a green pixel displaying the second defined color, and a blue pixel displaying the third defined color,
    the red pixel includes a dichroic transmission filter, and
    in the dichroic transmission filter, a red region to pass laser light of the color in the fourth chromaticity coordinates, and a green region to pass laser light of the second defined color are defined.

8. The display device of claim 7, wherein the green region is less than the red region.

9. The display device of claim 7, further comprising a light shielding layer disposed between the red region and the green region.

10. The display device of claim 1, wherein each of the pixels includes a red pixel displaying laser light of the color in the fourth chromaticity coordinates which is different from the first defined color, a green pixel displaying the second defined color, and a blue pixel displaying the third defined color, and
    the display panel further includes a controller configured to drive the pixel, where the controller is configured to output, upon reception of input of an image signal for causing the red pixel to display the first defined color, an image signal to display the red and green pixels to match the first defined color.

11. The display device of claim 1, further comprising a light guide plate, wherein
    the light guide plate includes an exit surface opposed to the display panel, a reflection surface in an opposite side of the exit surface, and an incident surface connecting the exit surface and the reflection surface, and the red semiconductor laser, the blue semiconductor laser, and the green semiconductor laser are aligned along the incident surface.

12. The display device of claim 1, further comprising:

a first substrate including pixel electrodes disposed in the pixels;

a second substrate opposed to the first substrate; and a liquid crystal layer between the first substrate and the second substrate, wherein the illumination device irradiates light to the first substrate.

* * * * *